(12) United States Patent
Goyal et al.

(10) Patent No.: US 11,460,961 B2
(45) Date of Patent: Oct. 4, 2022

(54) METHOD FOR DETERMINING PROXIMITY OF AT LEAST ONE OBJECT USING ELECTRONIC DEVICE

(71) Applicant: Samsung Electronics Co., Ltd., Suwon-si (KR)

(72) Inventors: Nitesh Goyal, Noida (IN); Sunil Rathour, Noida (IN); Sonam Chawla Bhatia, Noida (IN); Yash Gupta, Noida (IN); Abhishek Gogia, Noida (IN); Reetika Mittal, Noida (IN); Vipin Khushu, Noida (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

(21) Appl. No.: 16/994,077

(22) Filed: Aug. 14, 2020

(65) Prior Publication Data

US 2021/0055814 A1 Feb. 25, 2021

(30) Foreign Application Priority Data

Aug. 23, 2019 (IN) .............................. 201941034130

(51) Int. Cl.
*G06F 3/044* (2006.01)
*H03K 17/955* (2006.01)
*G06N 20/00* (2019.01)
*G06N 7/00* (2006.01)
*H03K 17/96* (2006.01)

(52) U.S. Cl.
CPC ............ *G06F 3/044* (2013.01); *G06N 7/005* (2013.01); *G06N 20/00* (2019.01); *H03K 17/955* (2013.01); *H03K 17/96* (2013.01)

(58) Field of Classification Search
CPC ........ G06F 3/044; G06N 20/00; G06N 7/005; H03K 17/955; H03K 17/96
USPC ................................. 345/173, 174; 382/209
See application file for complete search history.

(56) References Cited

U.S. PATENT DOCUMENTS

| 9,329,727 | B2 | 5/2016 | Wang et al. |
| 9,477,356 | B2 | 10/2016 | Shen et al. |
| 10,318,034 | B1 | 6/2019 | Hauenstein et al. |
| 2008/0158145 | A1* | 7/2008 | Westerman ......... G06F 3/04182 |
| | | | 382/209 |

(Continued)

FOREIGN PATENT DOCUMENTS

| KR | 10-2014-0139767 A | 12/2014 |
| KR | 10-1649750 B1 | 8/2016 |

OTHER PUBLICATIONS

Indian Office Action dated Mar. 31, 2021, issued in Indian Application No. 201941034130.

(Continued)

*Primary Examiner* — Prabodh M Dharia
(74) *Attorney, Agent, or Firm* — Jefferson IP Law, LLP

(57) ABSTRACT

A method for determining a proximity of at least one object using an electronic device is provided. The method includes obtaining hover data from a touch panel of the electronic device. Further, the method includes determining at least one of a first hover or a second hover based on the hover data of the at least one object obtained for the touch panel. Further, the method includes determining the proximity of the at least one object to the touch panel of the electronic device based on at least one of the first hover or the second hover.

18 Claims, 16 Drawing Sheets

(56) References Cited

U.S. PATENT DOCUMENTS

| | | | |
|---|---|---|---|
| 2008/0158182 A1* | 7/2008 | Westerman | G06F 3/04166 |
| | | | 345/173 |
| 2009/0284495 A1* | 11/2009 | Geaghan | G06F 3/041662 |
| | | | 345/174 |
| 2011/0025635 A1 | 2/2011 | Lee | |
| 2014/0354565 A1 | 12/2014 | Yoon | |
| 2015/0002425 A1* | 1/2015 | Lee | G06F 3/0416 |
| | | | 345/173 |
| 2017/0080288 A1* | 3/2017 | Roh | G09B 19/0038 |
| 2017/0090668 A1* | 3/2017 | Agarwal | G06F 3/044 |
| 2017/0140644 A1* | 5/2017 | Hwang | G08C 17/02 |
| 2017/0160856 A1 | 6/2017 | Pillarisetty | |
| 2017/0220141 A1 | 8/2017 | Short et al. | |
| 2017/0269765 A1* | 9/2017 | Yoon | G06F 3/017 |
| 2017/0351896 A1* | 12/2017 | Jiang | G06V 40/1306 |
| 2018/0157371 A1 | 6/2018 | Harrison et al. | |
| 2018/0341324 A1 | 11/2018 | Hotelling et al. | |
| 2019/0101996 A1* | 4/2019 | Lawrence | G06F 3/03547 |

OTHER PUBLICATIONS

International Search Report dated Nov. 11, 2020, issued in International Application No. PCT/KR2020/010839.

\* cited by examiner

FIG. 3C
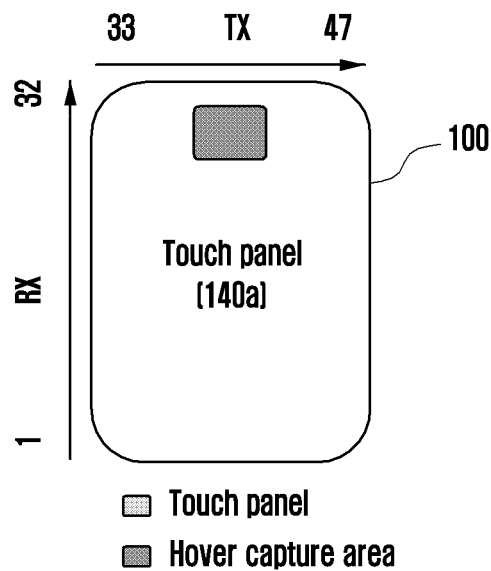
(a)
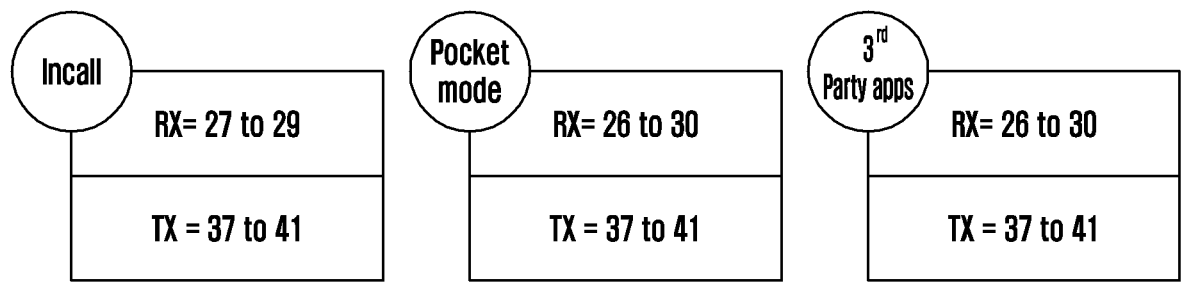
(b)
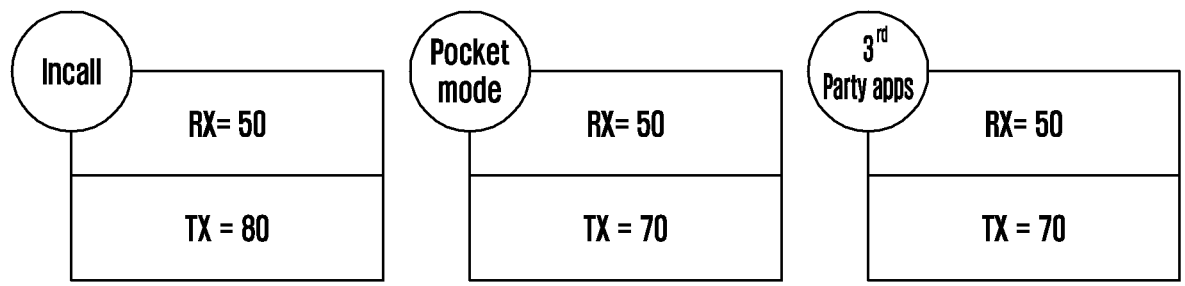
(c)

▨ TSP
▩ Hover capture area

| TX | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|
| [0] | 1000 | 1050 | 900 | 880 | 700 | 660 | 580 | 400 | 440 | 660 | 700 | 880 | 900 | 1050 | 1000 |
| [1] | 600 | 500 | 400 | 360 | 300 | 280 | 260 | 360 | 380 | 280 | 300 | 360 | 400 | 500 | 600 |

(a)

| RX | 32...29 | 32...29 | 25...20 | 19...15 | 14...11 | 10 | 9 | 8 | 7 | 6 | 5 | 4 | 3 | 2 | 1 |
|---|---|---|---|---|---|---|---|---|---|---|---|---|---|---|---|
| [0] | 1000 | 1050 | 900 | 880 | 700 | 660 | 580 | 400 | 440 | 660 | 700 | 880 | 900 | 1050 | 1000 |
| [1] | 600 | 500 | 400 | 360 | 300 | 280 | 260 | 360 | 380 | 280 | 300 | 360 | 400 | 500 | 600 |

| RX | 32 | 31 | 30 | 29…26 |
|---|---|---|---|---|
| [0] | 1000 | 1050 | 900 | 880 |
| [1] | 880 | 810 | 860 | 860 |

(c)

| RX | 29 | 28 | 27 |
|---|---|---|---|
| [0] | 1000 | 1050 | 900 |
| [1] | 880 | 810 | 860 |

| TX | 37 | 38 | 39 | 40 | 41 |
|---|---|---|---|---|---|
| [0] | 700 | 660 | 580 | 400 | 440 |
| [1] | 650 | 280 | 260 | 310 | 400 |

(d)

| RX | 32 | 31 | 30 | 29…26 |
|---|---|---|---|---|
| [0] | 960 | 850 | 900 | 880 |
| [1] | 880 | 790 | 860 | 860 |
| Difference | 80 | 60 | 40 | 20 |

| TX | 37 | 38 | 39 | 40 | 41 |
|---|---|---|---|---|---|
| [0] | 700 | 450 | 380 | 400 | 440 |
| [1] | 650 | 280 | 260 | 310 | 400 |
| Difference | 50 | 170 | 120 | 90 | 40 |

(e)

| TX | 37 | 38 | 39 |
|---|---|---|---|
| DIFF | 200 | 177 | 95 |

| RX | DIFF |
|---|---|
| 29 | 99 |
| 28 | 77 |
| 27 | 60 |

Touch panel (140a)

| Threshold | | |
|---|---|---|
| Modes | RXDiff | TXDiff |
| Call | 50 | 80 |
| Pocket | 50 | 80 |
| 3rd Party | 50 | 80 |

(a)  (b)

| RX | 27 | 28 | 29 |
|---|---|---|---|
| [0] | 200 | 400 | 450 |
| [1] | 145 | 340 | 400 |
| [2] | 100 | 300 | 200 |

| TX | 37 | 38 | 39 |
|---|---|---|---|
| [0] | 330 | 200 | 850 |
| [1] | 350 | 240 | 860 |
| [2] | 200 | 100 | 600 |

Case -1

Case -2

Case 1 : Diff Rx >50 and Diff Tx <80

Case 2 : Diff Rx >50 and Diff Tx >80

(c)

FIG. 4
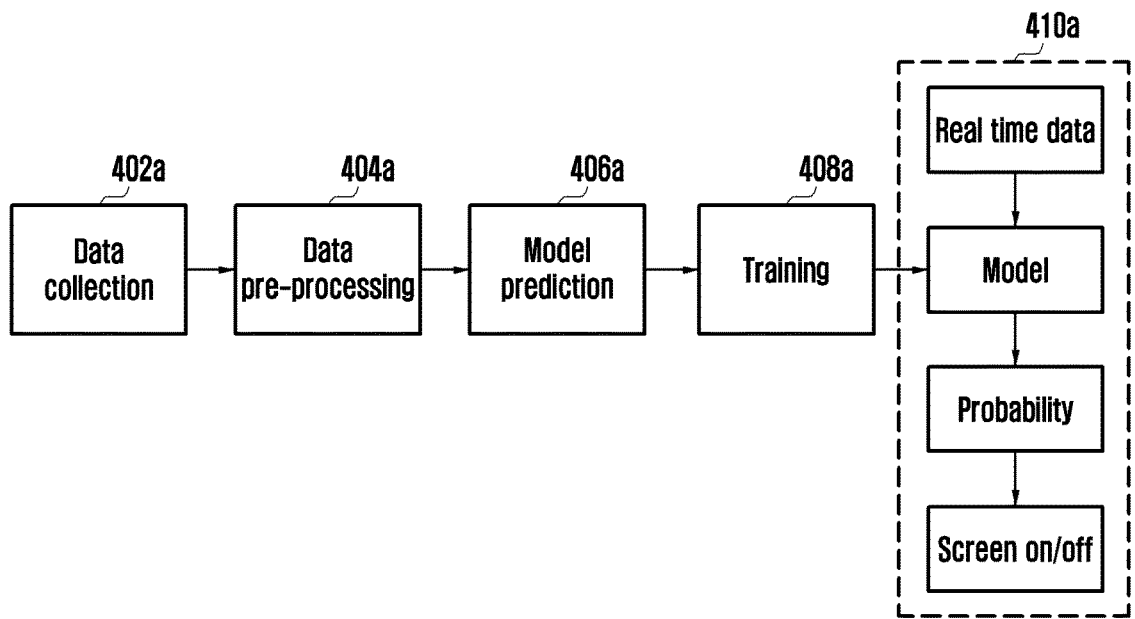
(a)
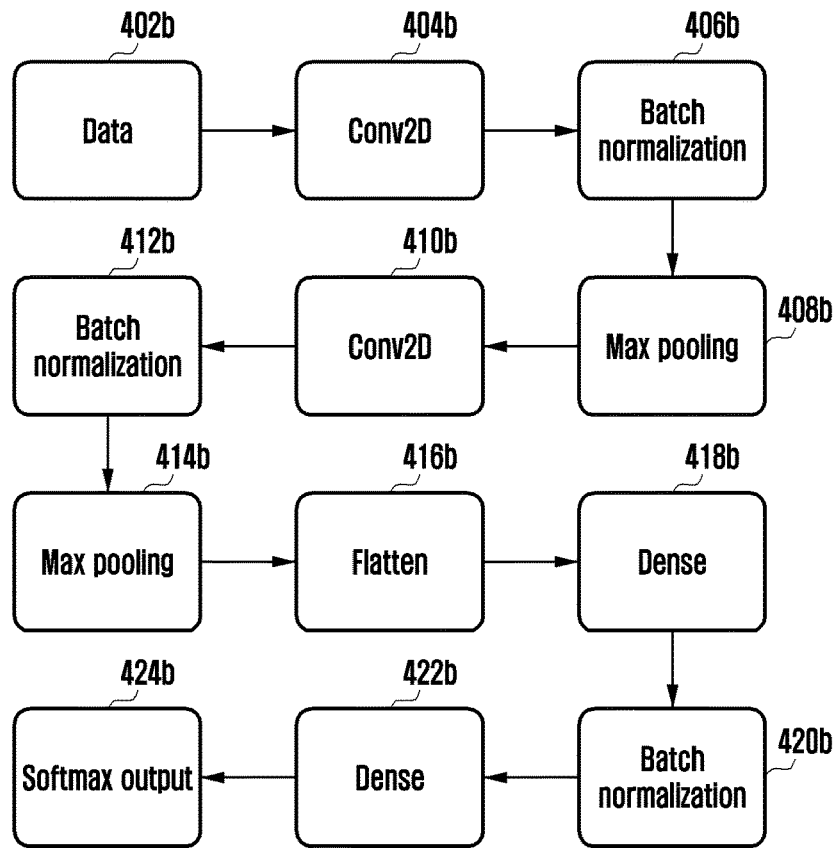
(b)

METHOD FOR DETERMINING PROXIMITY OF AT LEAST ONE OBJECT USING ELECTRONIC DEVICE

CROSS-REFERENCE TO RELATED APPLICATION(S)

This application is based on and claims priority under 35 U.S.C. § 119(a) of an Indian patent application number 201941034130, filed on Aug. 23, 2019, in the Indian Intellectual Property Office, the disclosure of which is incorporated by reference herein in its entirety.

BACKGROUND

1. Field

The disclosure relates to a method for determining a proximity of at least one object using an electronic device.

2. Description of Related Art

Many types of input devices are presently available for performing operations in a computing system, such as buttons or keys, mice, trackballs, joysticks, touch sensor panels, touch screens and a like. Touch screens, in particular, are becoming increasingly popular because of their ease and versatility of operation as well as their declining price. The touch screen can include a transparent touch sensor panel positioned in front of a display device, such as a liquid crystal display (LCD), or an integrated touch screen in which touch sensing circuitry is partially or fully integrated into the display, and the like. Touch screens can allow a user to perform various functions by touching the touch screen using a finger, stylus or other objects at a location that may be dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

While some touch sensors and a proximity sensor can also detect a hover event, i.e., an object near but not touching the touch sensor, typical hover detection information may be of limited practical use due to, for example, limited hover detection range, an inefficient gathering of hover information, and the like.

In an existing system, an electronic device needs a proximity hardware sensor to detect the hover event and because of the proximity hardware sensor production cost of the electronic device increases. Further, the proximity hardware sensor takes a lot of space in the front screen display of the electronic device. Further, to create a fully bezel-less screen it is required to find an alternative solution to replace the proximity hardware sensor. A solution is required which performs all the function of proximity without increasing any other hardware component. So, the proposed system and method focuses on the detection of the hover event without using the proximity hardware sensor.

Thus, it is desired to address the above mentioned disadvantages or other shortcomings or at least provide a useful alternative.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method and system for determining a proximity of at least one object using an electronic device.

Another aspect of the disclosure is to obtain hover data from a touch panel of the electronic device.

Another aspect of the disclosure is to determine at least one of a first hover or a second hover based on the hover data of the at least one object obtained for the touch panel.

Another aspect of the disclosure is to determine the proximity of the at least one object to the touch panel of the electronic device based on at least one of the first hover or the second hover.

Additional aspects will be set forth in part in the description which follows and, in part, will be apparent from the description, or may be learned by practice of the presented embodiments.

In accordance with an aspect of the disclosure a method for determining a proximity of at least one object using an electronic device is provided. The method includes obtaining hover data from a touch panel of the electronic device. Further, the method includes determining at least one of a first hover or a second hover based on the hover data of the at least one object obtained for the touch panel. Further, the method includes determining the proximity of the at least one object to the touch panel of the electronic device based on at least one of the first hover or the second hover.

In accordance with an aspect of the disclosure, the first hover is a touch panel calculation-based hover and the second hover is a machine learning (ML)-based hover.

In accordance with an aspect of the disclosure, the hover data is obtained based on at least one of sensor comprising a capacitive sensor, a resistive sensor, an inductive sensor, an ultrasonic sensor, and a luminance sensor.

In accordance with an aspect of the disclosure, the hover data is obtained based on a change in capacitance of column and row electrodes of the touch panel while the hover of the at least one object is detected over the touch panel of the electronic device.

In accordance with an aspect of the disclosure, the column and row electrodes of the touch panel are automatically configured by detecting the at least one application running in the electronic device, determining, by the electronic device, the column and row electrodes of a row-and-column electrode matrix of the touch screen based on the at least one application running in the electronic device, and automatically configuring the column and row electrodes to obtain the hover data of the at least one object.

In accordance with an aspect of the disclosure, determining the first hover based on the hover data of the at least one object obtained for the touch panel includes obtaining the hover data at a first time, obtaining the hover data at a second time, determining a hover data difference between the hover data obtained at the first time with the hover data obtained at the second time, determining whether the hover data difference meets a capacitance threshold, and determining the first hover when the hover data difference meets the capacitance threshold.

In accordance with an aspect of the disclosure, the second hover is determined by using a trained probabilistic touch screen panel (TSP) hover ML model of the touch panel based on the obtained the hover data over a plurality of time intervals.

In accordance with an aspect of the disclosure, determining the proximity of the at least one object to the touch panel of the electronic device based on the first hover and the second hover includes assigning a first dynamic weight to the first hover, assigning a second dynamic weight to the second hover, determining a candidate hover based on the first hover, the first dynamic weight assigned to the first hover, the second hover, and the second dynamic weight assigned to the second hover, determining whether the candidate hover meets a hover threshold, and detecting one of the at least one object is in the proximity to the touch panel of the electronic device when the candidate hover meets the hover threshold and the at least one object is not in the proximity to the touch panel of the electronic device when the candidate hover does not meet the hover threshold.

In accordance with another aspect of the disclosure, an electronic device for determining a proximity of at least one object using the electronic device is provided. The electronic device includes a memory and at least one processor operationally coupled to the memory. The at least one processor is configured to obtain hover data from a touch panel of the electronic device. Further, the at least one processor is configured to determine at least one of a first hover and a second hover based on the hover data of the at least one object obtained for the touch panel. Further, the at least one processor is configured to determine the proximity of the at least one object to the touch panel of the electronic device based on at least one of the first hover and the second hover.

Other aspects, advantages and salient features of the disclosure will become apparent to those skilled in the art from the following description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3C illustrates a setting range and a threshold difference value of column and row electrodes of a touch panel for different modes according to an embodiment of disclosure;

FIGS. 3D and 3E illustrate setting range and threshold difference value of column and row electrodes of a touch panel after experimenting with hardware proximity sensor data according to various embodiments of disclosure;

FIG. 4 illustrates a second hover determined by using a trained probabilistic touch screen panel (TSP) hover machine learning (ML) model of a touch panel based on an obtained hover data over a plurality of time intervals according to an embodiment of disclosure;

The same reference numerals are used to represent the same elements throughout the drawings.

DETAILED DESCRIPTION

Figure 1:
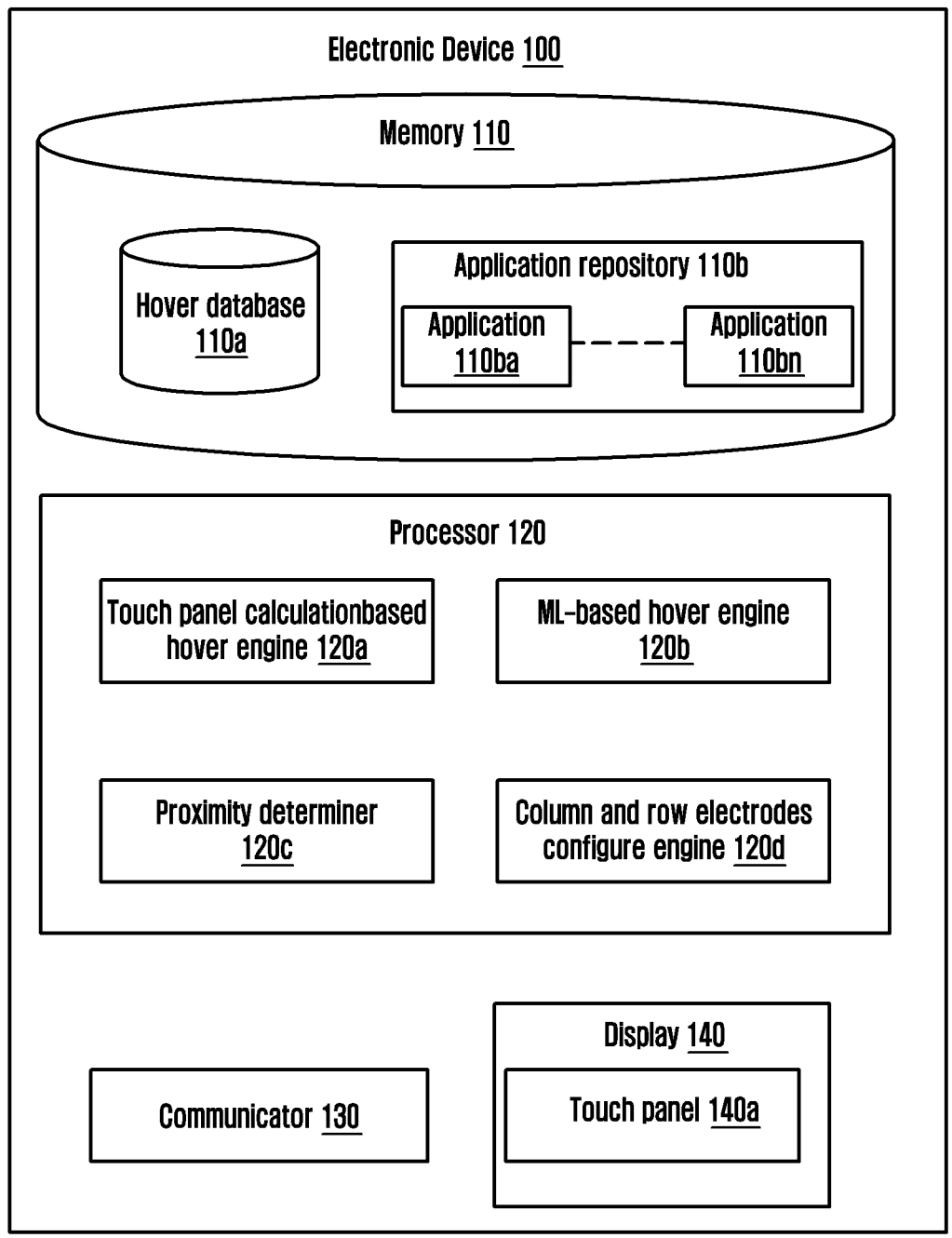
FIG. 1 illustrates a block diagram of an electronic device for determining a proximity of at least one object while using at least one application in the electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Descriptions of well-known components and processing techniques are omitted so as to not unnecessarily obscure the embodiments herein. In addition, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as units or modules or the like, are physically implemented by analog or digital circuits, such as logic gates, integrated circuits, microprocessors, microcontrollers, memory circuits, passive electronic components, active electronic components, optical components, hardwired circuits, or the like, and may optionally be driven by firmware and software. The circuits may, for example, be embodied in one or more semiconductor chips, or on substrate supports, such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The accompanying drawings are used to help easily understand various technical features and it should be understood that the embodiments presented herein are not limited by the accompanying drawings. As such, the disclosure should be construed to extend to any alterations, equivalents and substitutes in addition to those which are particularly set out in the accompanying drawings. Although the terms first, second, and the like, may be used herein to describe various elements, these elements should not be limited by these terms. These terms are generally only used to distinguish one element from another.

Accordingly, embodiments herein achieve a method for determining a proximity of at least one object using an electronic device. The method includes obtaining hover data from a touch panel (i.e., a touch screen panel (TSP)) of the electronic device. Further, the method includes determining at least one of a first hover and a second hover based on the hover data of the at least one object obtained for the touch panel. Further, the method includes determining the proximity of the at least one object to the touch panel of the electronic device based on at least one of the first hover and the second hover.

Referring now to the drawings, and more particularly to FIGS. 1 through 9B, there are shown preferred embodiments.

FIG. 1 illustrates a block diagram of an electronic device for determining a proximity of at least one object while using at least one application in the electronic device according to an embodiment of the disclosure.

Referring to FIG. 1, an electronic device (100) can be, for example, but not limited to a smartphone, a laptop, a desktop, a smartwatch, a smart TV or a like.

In an embodiment of the disclosure, the electronic device (100) includes a memory (110), a processor (120), a communicator (130), a display (140), and a touch panel (140a).

The memory (110) also stores instructions to be executed by the processor (120). The memory (110) may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory (110) may, in some examples, be considered a non-transitory storage medium. The term "non-transitory" may indicate that the storage medium is not embodied in a carrier wave or a propagated signal. However, the term "non-transitory" should not be interpreted that the memory (110) is non-movable. In some examples, the memory (110) can be configured to store larger amounts of information than the memory. In certain examples, a non-transitory storage medium may store data that can, over time, change (e.g., in Random Access Memory (RAM) or cache). In an embodiment of the disclosure, the memory (110) can be an internal storage unit or it can be an external storage unit of the electronic device (100), a cloud storage, or any other type of external storage.

The memory (110) includes a hover database (110a) and an application repository (110b). The hover database (110a) is configured to store hover data from a touch panel (140a) of the electronic device (100) while using the at least one application in the electronic device (100). The hover data is at least one of the first hover and second hover values (e.g., RX and TX values). RX provides the sum of capacitance of row electrode and TX provides the sum of the capacitance of column electrode.

The application repository (110b) is configured to store hover data of different application of the electronic device (100), the application repository (110ba to 110bn) can be, for example, but not limited to calling application, gallery application, camera application, gaming application, business application, education application, lifestyle application, entertainment application, utility application, travel application, health, and fitness application.

The processor (120) communicates with the memory (110), the communicator (130), and the display (140). The processor (120) is configured to execute instructions stored in the memory (110) and to perform various processes. In an embodiment of the disclosure, the processor (120) includes a touch panel calculation-based hover engine (120a), an ML-based hover engine (120b), a proximity determiner (120c), a column and row electrodes configure engine (120d).

The processor (120) is configured to obtain hover data from a touch panel (140a) of the electronic device (100) using the electronic device (100). Further, the processor (120) is configured to determine at least one of a first hover and a second hover based on the hover data of the at least one object obtained for the touch panel (140a). In an embodiment of the disclosure, the hover data is obtained based on at least one of sensor comprising a capacitive sensor, a resistive sensor, an inductive sensor, an ultrasonic sensor, and a luminance sensor.

Further, the processor (120) is configured to determine the proximity of the at least one object to the touch panel (140a) of the electronic device (100) based on at least one of the first hover and the second hover.

In an embodiment of the disclosure, the first hover is a touch panel calculation-based hover (i.e., HV1) and the second hover is a machine learning (ML)-based hover (i.e., HV2).

In an embodiment of the disclosure, the hover data is obtained based on a change in capacitance of column (i.e., TX) and row (i.e., RX) electrodes of the touch panel (140a) while the hover of the at least one object is detected over the touch panel (140a) of the electronic device (100). In other embodiments of the disclosure, the hover data is obtained based on a change in resistance when the sensor used in the touch panel is resistive sensor. In yet another embodiment of the disclosure, the hover data is obtained based on a change in inductance when the sensor used in the touch panel is inductive sensor. In yet another embodiment of the disclosure, the hover data is obtained based on a change in ultrasonic when the sensor used in the touch panel is ultrasonic sensor. In yet another embodiment of the disclosure, the hover data is obtained based on a change in luminance when the sensor used in the touch panel is luminance sensor.

The touch panel calculation-based hover engine (120a) is configured to determine the first hover based on the hover data of the at least one object obtained for the touch panel (140a). Further, the touch panel calculation-based hover engine (120a) obtains the hover data at a first time, obtains the hover data at a second time, determines a hover data difference (i.e., RXDiff and TXDiff) between the hover data obtained at the first time with the hover data obtained at the second time, determines whether the hover data difference meets an electrode threshold (i.e., RX_Threshold and TX_Threshold), and determines the first hover when the hover data difference meets the electrode threshold (i.e., RXDiff greater than RX_Threshold and TXDiff greater than TX_Threshold).

The ML-based hover engine (120b) determines the second hover by using a trained probabilistic touch screen panel (TSP) hover ML model of the touch panel (140a) based on the obtained the hover data over a plurality of time intervals.

The proximity determiner (120c) is configured to determine the proximity of the at least one object to the touch panel (140a) of the electronic device (100) based on the first hover and the second hover. Further, the proximity determiner (120c) assigns a first dynamic weight (i.e., coefficient A) to the first hover, assigns a second dynamic weight (i.e., coefficient B) to the second hover, determines a candidate hover (i.e., HV) based on the first hover, the first dynamic weight assigned to the first hover, the second hover, and the second dynamic weight assigned to the second hover, determines whether the candidate hover meets a hover threshold (i.e., 0.65), and detects one of the at least one object is in the proximity to the touch panel (140a) of the electronic device (100) when the candidate hover meets the hover threshold and the at least one object is not in the proximity to the touch panel (140a) of the electronic device (100) when the candidate hover does not meet the hover threshold.

The column and row electrodes configure engine (120d) is configure the column and row electrodes of the touch panel (140a) automatically. Further, the column and row electrodes configure engine (120d) detects the at least one application running (i.e., call mode/pocket mode/$3^{rd}$ party application mode) in the electronic device (100), determines the column and row electrodes of a row-and-column electrode matrix of the touch screen (i.e., the display (140)) based on the at least one application running in the electronic device (100), and automatically configure the column and row electrodes to obtain the hover data of the at least one object.

The communicator (130) is configured for communicating internally between internal hardware components and with external devices via one or more networks.

Although the FIG. 1 shows various hardware components of the electronic device (100) but it is to be understood that other embodiments are not limited thereon. In other embodiments of the disclosure, the electronic device (100) may include less or more number of components. Further, the labels or names of the components are used only for illustrative purpose and does not limit the scope of the disclosure. One or more components can be combined together to perform the same or substantially similar function to determine the proximity of at least one object while using at least one application in the electronic device (100).

Figure 2:
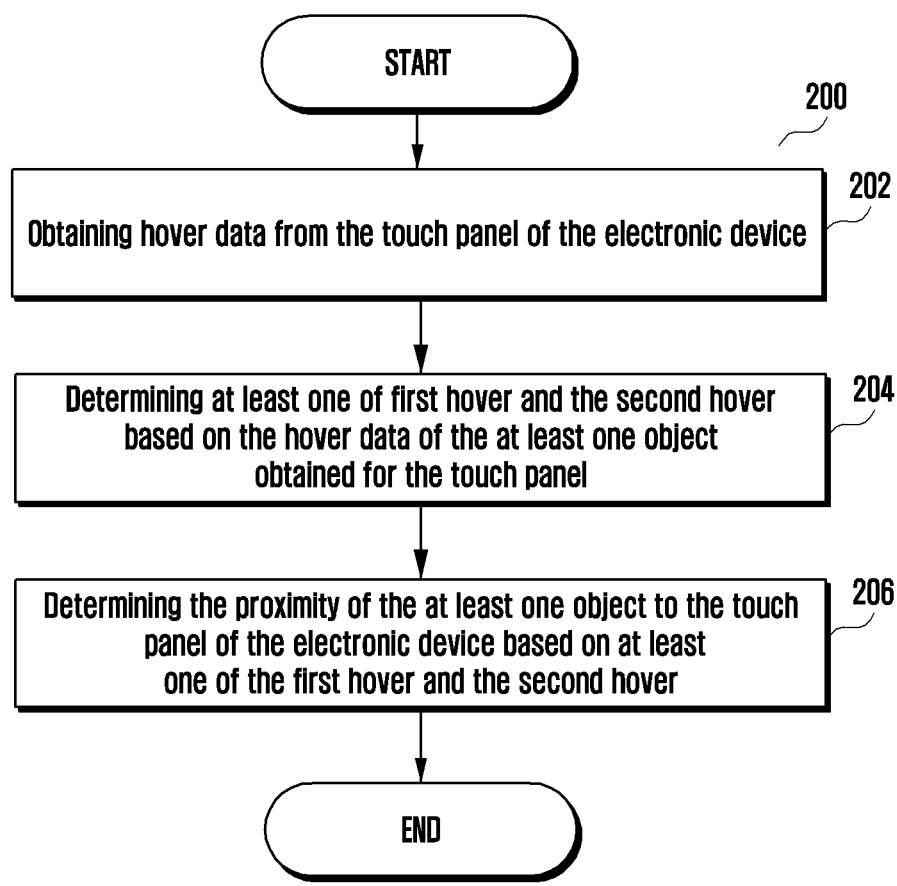
FIG. 2 is a flow diagram illustrating a method for determining a proximity of at least one object using an electronic device according to an embodiment of the disclosure.

FIG. 2 is a flow diagram 200 illustrating a method for determining a proximity of at least one object using an electronic device according to an embodiment of the disclosure.

Referring to FIG. 2, the operations (202-206) are performed by the electronic device (100).

At operation 202, the method includes obtaining hover data from the touch panel (140a) of the electronic device (100). At operation 204, the method includes determining at least one of the first hover and the second hover based on the hover data of the at least one object obtained for the touch panel (140a). At operation 206, the method includes determining the proximity of the at least one object to the touch panel (140a) of the electronic device (100) based on at least one of the first hover and the second hover.

Figure 3A:
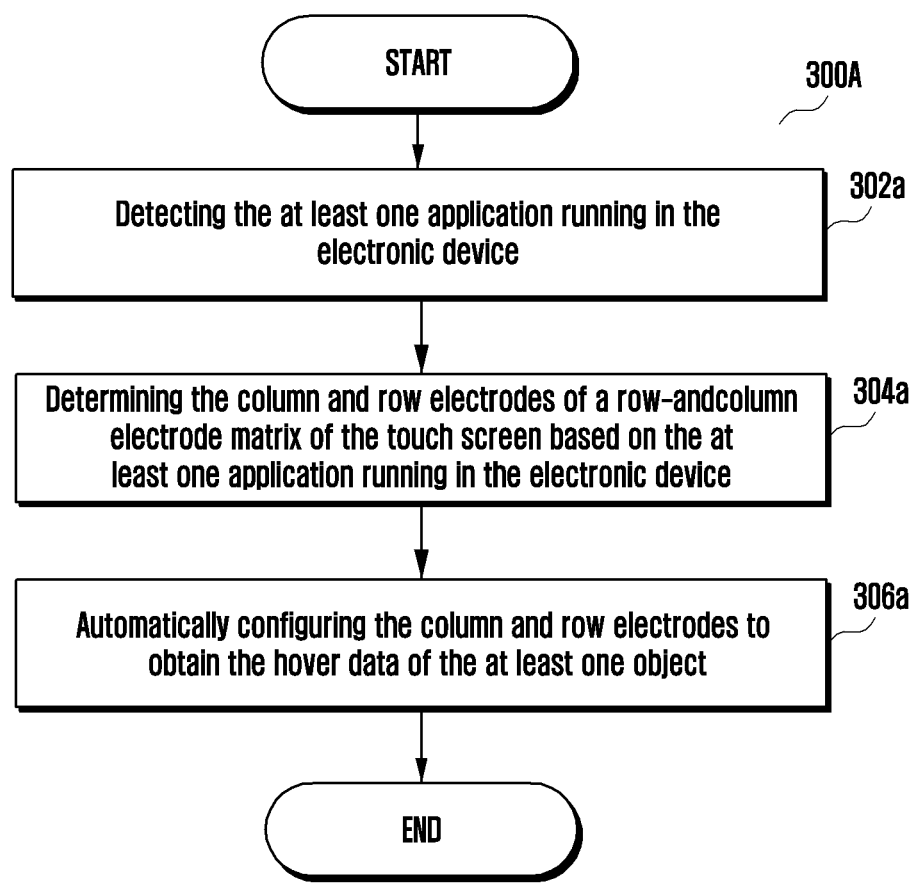
FIG. 3A is a flow diagram illustrating a method for automatic configuration of column and row electrodes of a touch panel according to an embodiment of disclosure.

FIG. 3A is a flow diagram 300A illustrating a method for automatic configuration of column and row electrodes of the touch panel according to an embodiment of the disclosure.

Referring to FIG. 3A, the operations (302a-306a) are performed by the column and row electrodes configure engine (120d).

At operation 302a, the method includes detecting the at least one application running in the electronic device (100). At operation 304a, the method includes determining the column and row electrodes of a row-and-column electrode matrix of the touch screen based on the at least one application running in the electronic device (100). At operation 306a, the method includes automatically configuring the column and row electrodes to obtain the hover data of the at least one object.

Figure 3B:
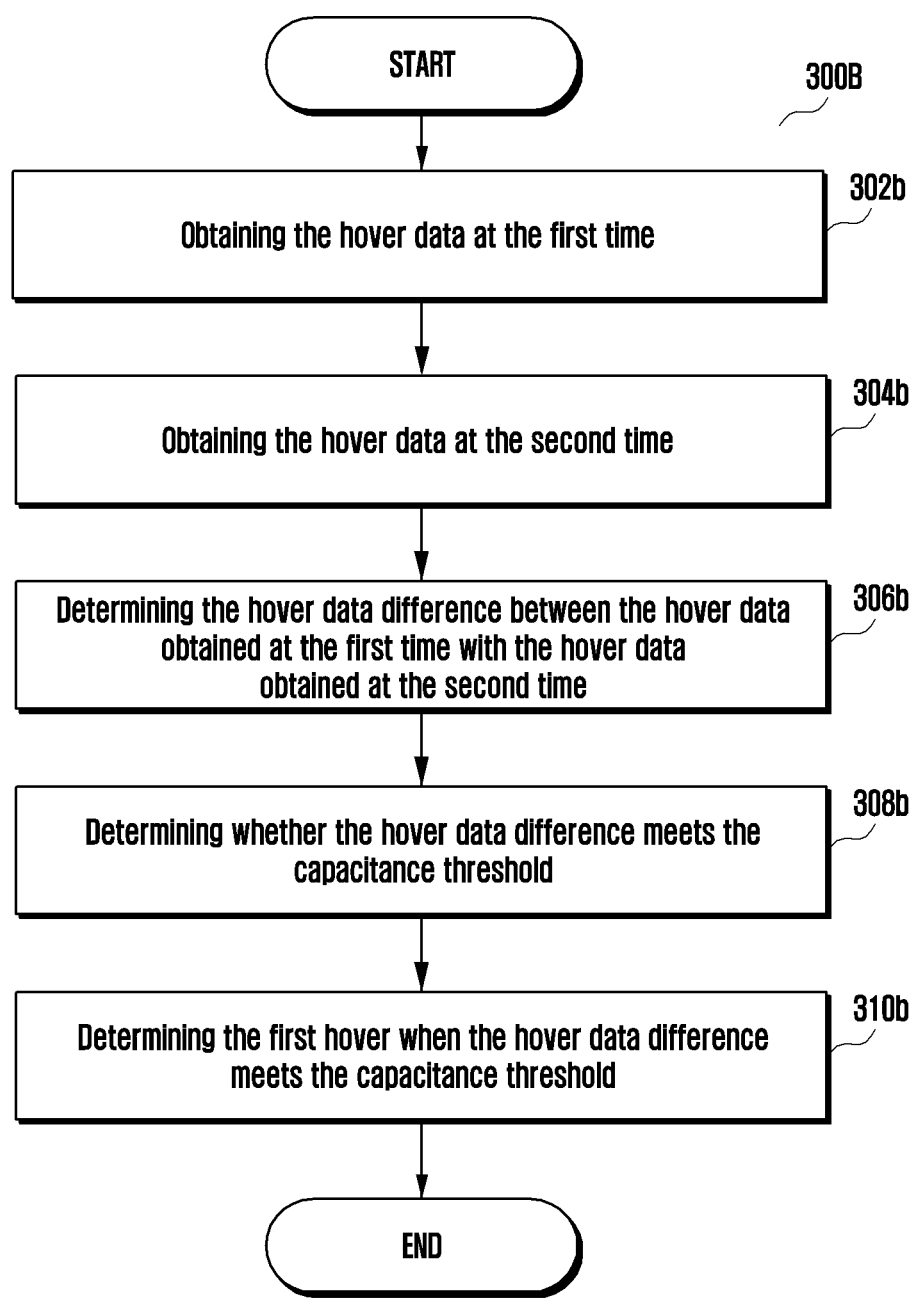
FIG. 3B is a flow diagram illustrating a method for determining a first hover based on a hover data of at least one object obtained for a touch panel according to an embodiment of disclosure.

FIG. 3B is a flow diagram 300B illustrating a method for determining a first hover based on a hover data of at least one object obtained for a touch panel) according to an embodiment of the disclosure.

Referring to FIG. 3B, the operations (302b-310b) are performed by the touch panel calculation-based hover engine (120a).

At operation 302b, the method includes obtaining the hover data at the first time. At operation 304b, the method includes obtaining the hover data at the second time. At operation 306b, the method includes determining the hover data difference between the hover data obtained at the first time with the hover data obtained at the second time. At operation 308b, the method includes determining whether the hover data difference meets the capacitance threshold. At operation 310b, the method includes determining the first hover when the hover data difference meets the capacitance threshold.

FIG. 3C illustrates setting range and threshold difference value of column and row electrodes of a touch panel for different modes according to an embodiment of the disclosure.

Referring to FIG. 3C, the notation "a" indicates that the RX and TX range for the electronic device (100). The RX range is 1 to 32 and the TX range is 33 to 47. The notation "b" indicates that different range of RX and TX to find out the best area of TSP on which hover data values should be observed to predict proximity for different modes (i.e., call mode/pocket mode/$3^{rd}$ party application mode). The notation "c" indicates that the threshold of RX and TX difference while calculating proximity in the proposed solution, a difference of consecutive RX and TX values are taken for different modes. The threshold is set to determine if the difference between various RX and TX values changes proximity/hover state or not.

Figure 3D:
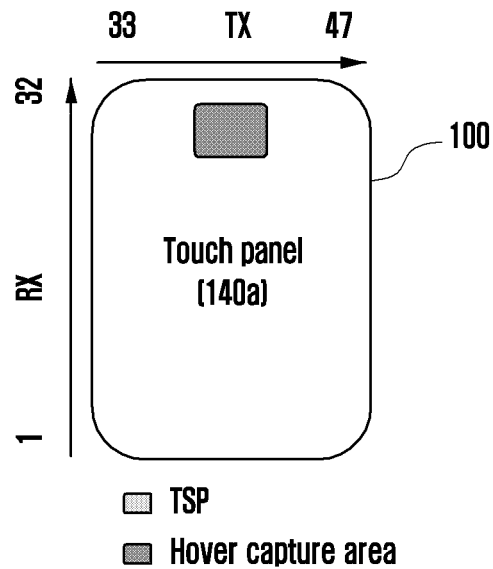

FIGS. 3D and 3E illustrate setting range and threshold difference value of column and row electrodes of a touch panel after experimenting with hardware proximity sensor data according to various embodiments of the disclosure.

Referring to FIGS. 3D and 3E, the notation "a" indicates that when the electronic device (100) held in hand normally, the TX values of ends increases. For this scenario range of the RX is 1 to 32 and range of the TX is 33 to 47. In result, the proposed solution detects proximity while for the same scenario the existing system with hardware proximity sensor detects no proximity. Because of wrong detection of the proximity the proposed method has to change in RX range from 27 to 29.

The notation "b" indicates that when hover done to bottom half of the electronic device (100). For this scenario range of the RX is 1 to 32 and range of the TX is 37 to 41. In result, the proposed solution detects proximity while for the same scenario the existing system with hardware proximity sensor detects no proximity Because of wrong detection of the proximity the proposed method has to change in RX range from 26 to 32.

The notation "c" indicates that when hover done to top half of the electronic device (100). For this scenario range of the RX is 26 to 32 and range of the TX is 37 to 41. In result, the proposed solution detects proximity while for the same scenario the existing system with hardware proximity sensor detects no proximity Because of the wrong detection of the proximity the proposed method has to change in RX range from 27 to 29.

The notation "d" indicates that when hover done on the electronic device (100) (i.e., while receiving a call). For this scenario range of the RX is 27 to 29 and range of the TX is 37 to 41. In result, the proposed solution detects proximity while for the same scenario the existing system with hardware proximity sensor detects proximity. Because of correct detection of the proximity the proposed method have to no change in RX and TX range.

The notation "e" indicates that difference in RX and TX value when hover on top half of the electronic device (100) with $0^{th}$ hover data (i.e., obtain hover data at the first time) record. For this example, for RX 32 $0^{th}$ hover data value is 960 and $1^{st}$ hover data value is 880. Difference between the $0^{th}$ and $1^{st}$ hover is 80.

Figure 3F:
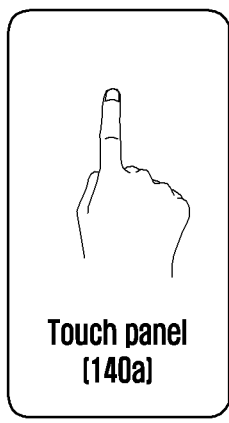
FIG. 3F illustrates a scenario of fetching hover data and calculating difference between column and row electrodes values to determine a first hover value according to an embodiment of disclosure.

FIG. 3F illustrates a scenario of fetching hover data and calculating difference between column and row electrodes values to determine a first hover value according to an embodiment of the disclosure.

Referring to FIG. 3F, the notation "a" indicates that reading of touch screen panel hover data (i.e., RX and TX) when any application of the electronic device (100) request for proximity sensor data of the electronic device (100). The notation "b" indicates a threshold value table of RXDiff and TXDiff for the different modes of the electronic device (100).

The notation "c" indicates that calculation of the first hover value based on a different value of the touch screen panel hover data. The touch screen panel hover data values are fetched on regular intervals of 100 ms. The touch screen panel hover data consist of 47 values (i.e., 32 RX value and 15 TX value). The proposed system and method calculate RXDiff and TXDiff value for 50 touch screen panel hover data to detect hover event. For each touch screen panel hover data RXDiff and TXDiff is calculated from the $0^{th}$ hover data. The proposed system and method enable hover if RXDiff and TXDiff is exceed the respective thresholds.

For case-1, calculate the difference between $0^{th}$ hover data and $1^{st}$ hover data values. In the case-1, the difference between $0^{th}$ hover data and $1^{st}$ hover data value is lower than respective threshold value. So, the first hover is disabled (i.e., HV1=0). For case-2, calculate the difference between $0^{th}$ hover data and $2^{nd}$ hover data values. In the case-2, the difference between $0^{th}$ hover data and 2nd hover data value is greater than respective threshold value. So, the first hover is enabled (i.e., HV1=1).

FIG. 4 illustrates a second hover determined by using a trained probabilistic TSP hover ML model of the touch panel based on obtained hover data over a plurality of time intervals according to an embodiment of disclosure.

Referring to FIG. 4, the notation "a" indicates the ML model to calculate the second hover (i.e., HV2) value. The ML model gives the proximity based on the current RXDiff and TXDiff.

At 402a, the method includes collecting an array of 48 values of the hover data consisting of 47 hover values (i.e., 32 RX and 15 TX values) and storing the proximity value at $48^{th}$. At 404a, the method includes normalizing the array and converting into 32×15 matrix. The normalizing Equation 1 is given below, $$X' = \frac{X - \mu}{\sigma} \qquad \text{Equation 1}$$

Where µ is mean and σ is a standard deviation.

At 406a, the method includes predicting the proximity by feeding input to a model consisting of two convolution (Cony) and one flatten layer (FC layer). The convolutional neural network (CNN) model is meant to be run on the electronic device (100) (e.g., android devices). The requirement to make a network as shallow as possible. So, the network takes less time to give output by reducing computations. The proposed system and method has only two convolution layers and only one flatten layer which was giving very high accuracy on the training and testing dataset. Accordingly, there is no need to add unnecessary layers which does not improve the accuracy of the model and increases the total training parameters and matrix operations. At 408a, the method includes training the model on around 20K samples. At 410a, the method includes calculating the probability of the second hover value based on real-time data. For example, if probability is greater than 0.7 than set HV2=1 else HV2=0.

The notation "b" indicates flow of the proposed sequential model. At step 402b-414b, input is passed through two sets of convolution, batch normalization, and max pooling layers. The convolution layer is used to extract features set from raw data. The Batch normalization layer normalize the output of the convolution layer which helps layers to learn more stable distribution of the inputs and increases the training speed. The max pooling layer is used to reduce spatial size of given data to reduce training parameters and computations. At step 416b, after second max pooling layer, flatten data converts the input from two dimensional to one dimensional array. At step 418b-422b, applies the 1 dimensional array to dense layers to predict final output by passing through a batch normalization. At step 424b, softmax activation at output layer converts the output into probabilistic distribution.

Figure 5:
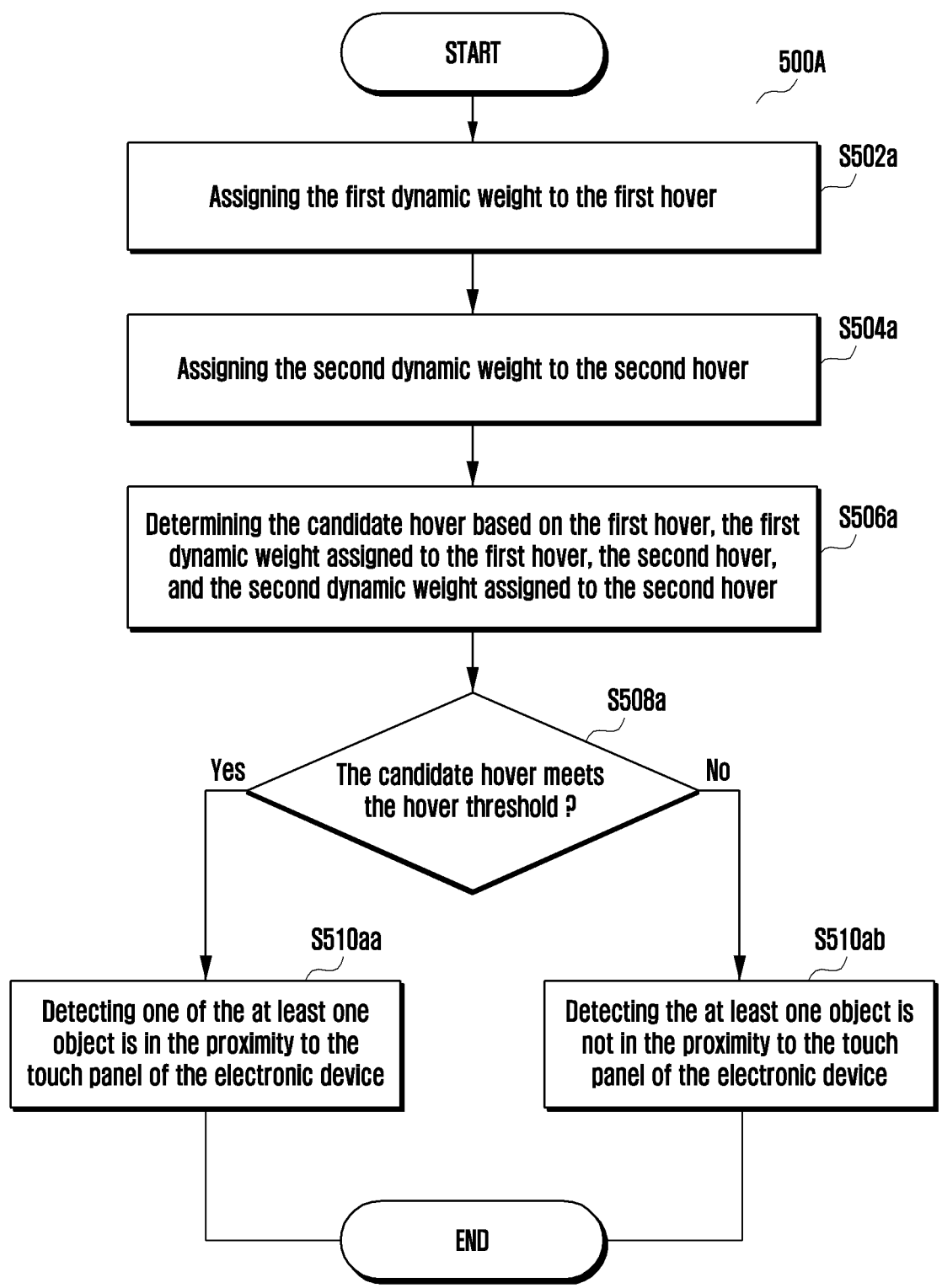
FIG. 5 is a flow diagram illustrating a method for determining a proximity of at least one object to a touch panel of an electronic device based on a first hover and a second hover according to an embodiment disclosure.

FIG. 5 is a flow diagram 500A illustrating a method for determining a proximity of at least one object to a touch panel of an electronic device based on a first hover and a second hover according to an embodiment of the disclosure.

Referring to FIG. 5, the operations (502a-510aa and 502a-510ab) are performed by the proximity determiner (120c).

At operation 502a, the method includes assigning the first dynamic weight (i.e., coefficient A) to the first hover. At operation 504a, the method includes assigning the second dynamic weight (i.e., coefficient B) to the second hover. At operation 506a, the method includes determining the candidate hover (i.e., HV) based on the first hover, the first dynamic weight assigned to the first hover, the second hover, and the second dynamic weight assigned to the second hover. At operation 508a-510aa, the method includes detecting one of the at least one object is in the proximity to the touch panel (140a) of the electronic device (100) if candidate hover does meet the hover threshold (i.e., 0.65). At operation 508a-510ab, the method includes detecting the at least one object is not in the proximity to the touch panel (140a) of the electronic device (100) if candidate hover does not meet the hover threshold.

$$HV=(A*HV1)+(B*HV2) \quad \text{Equation 2}$$

HV>=0.65, Proximity=1 (in proximity)

HV<0.65, Proximity=0 (not in proximity)

Different models show different TX and RX data. During training the ML Model, the accuracy is determined.

$$Accuracy = 1 - \frac{\text{No of Incorrect Proximity Calculated by } TSP \text{ Hover Process}}{\text{Total Records Considered for } ML} \quad \text{Equation 3}$$

Based on the accuracy the values of coefficients A and B are calculated. Coefficient of TSP hover value (HV1) 'A' is calculated as, $$A=(1-\text{Accuracy}) \quad \text{Equation 4}$$

Coefficient of TSP hover value of ML model (HV2) 'B' is calculated as, $$B=\text{Accuracy} \quad \text{Equation 5}$$

If accuracy is less, the TSP Hover process result (HV1) is given more weightage (A>B). If accuracy is more, the TSP Hover ML Model result (HV2) is given more weightage (B>A).

For example see Table 1

TABLE 1

| ML model training (Device A) | |
|---|---|
| TSP hover process result correct | 95500 |
| TSP hover process result incorrect | 4500 |
| Total TSP hover data considered | 100000 |

According to Table 1, Accuracy=1−(4500/100000)=0.955, A=1−0.955=0.045, B=0.955=0.955. Since the ML result was more accurate in this case, the coefficient B>A.

TABLE 2

| ML model training (Device B) | |
|---|---|
| TSP hover process result correct | 5500 |
| TSP hover process result incorrect | 94500 |
| Total TSP hover data considered | 100000 |

According to Table 2, Accuracy=1−(94500/100000)=0.055, A=1−0.055=0.945, B=0.055=0.055. Since the calculation result was more accurate in this case, the coefficient A>B. The variables A and B are electronic device (100) dependent.

Figure 6:
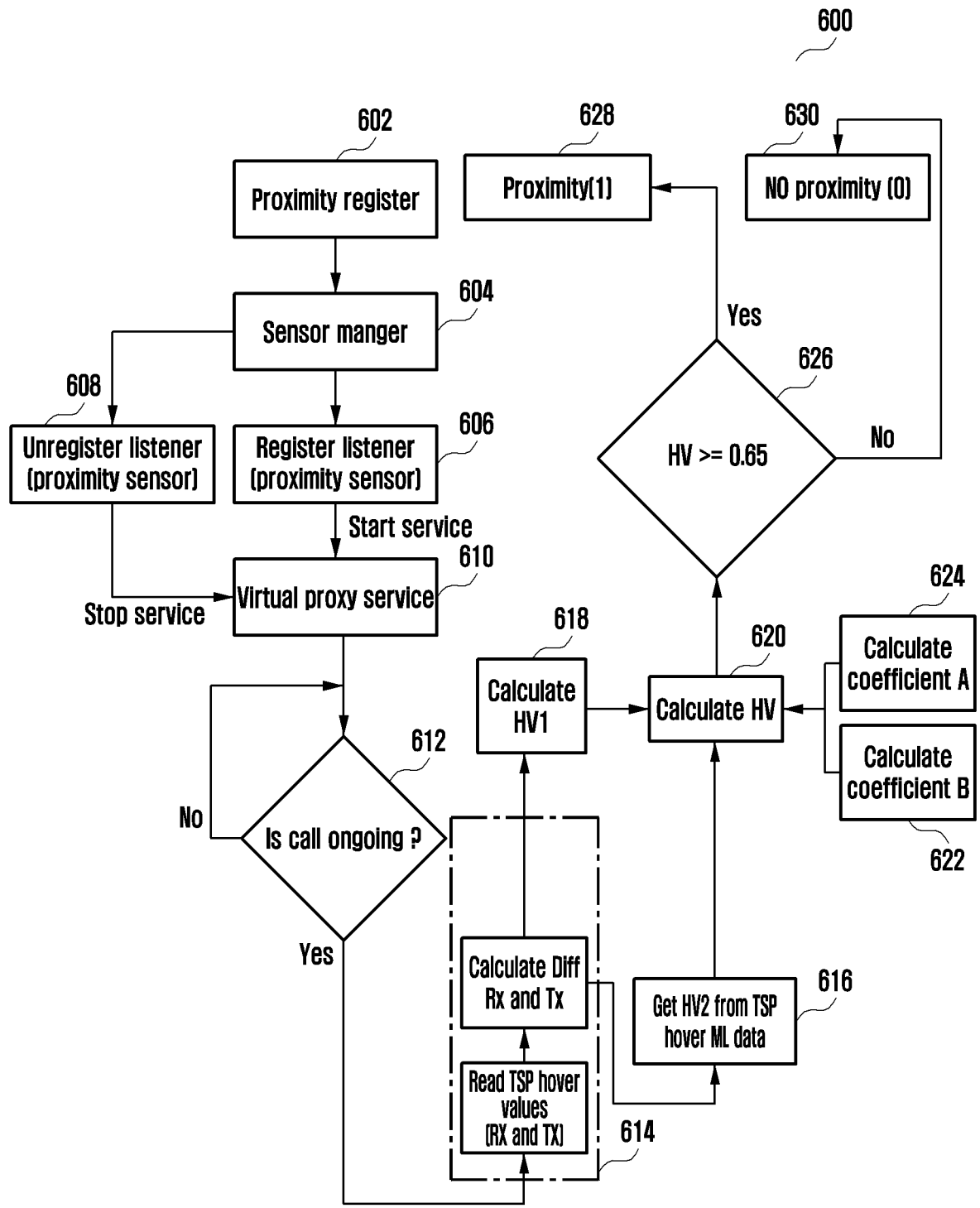
FIG. 6 is a flow diagram illustrating a method for determining a proximity for an In call mode and a $3^{rd}$ party application mode according to an embodiment disclosure.

FIG. 6 is a flow diagram 600 illustrating a method for determining a proximity for an In call mode and $3^{rd}$ party application mode according to an embodiment of the disclosure.

Referring to FIG. 6, the operations (602-630) are performed by the electronic device (100).

At 602-610, the method includes registering proximity sensor value for the proximity sensor when Incall or/and a $3^{rd}$ party application in the electronic device (100) needs the proximity sensor value. Virtual proxy service activates if any application registers proximity sensor else virtual proxy service deactivates. At 612, the method includes determining status of call application. The proposed method and system calculates the proximity if the call is ongoing.

At 614-630, the proposed method and system calculates the proximity. The proposed system and method fetching TSP hover data (i.e., the first hover calculation) values on regular intervals of 100 ms is started. TSP hover data consists of 47 values i.e., 32 RX values and 15 TX values. RX and TX Values are extracted from TSP hover data. RX values are filtered from range 27 to 29 and TX values are filtered from range 37 to 41. The proposed method and system considers threshold of 50 TSP hover records. Experimenting with different scenarios, the proposed method and system deduced RX_Threshold=50. TX_Threshold=80. For detecting the proximity by the proposed method and system already described in FIG. 3C to FIG. 5.

Figure 7:
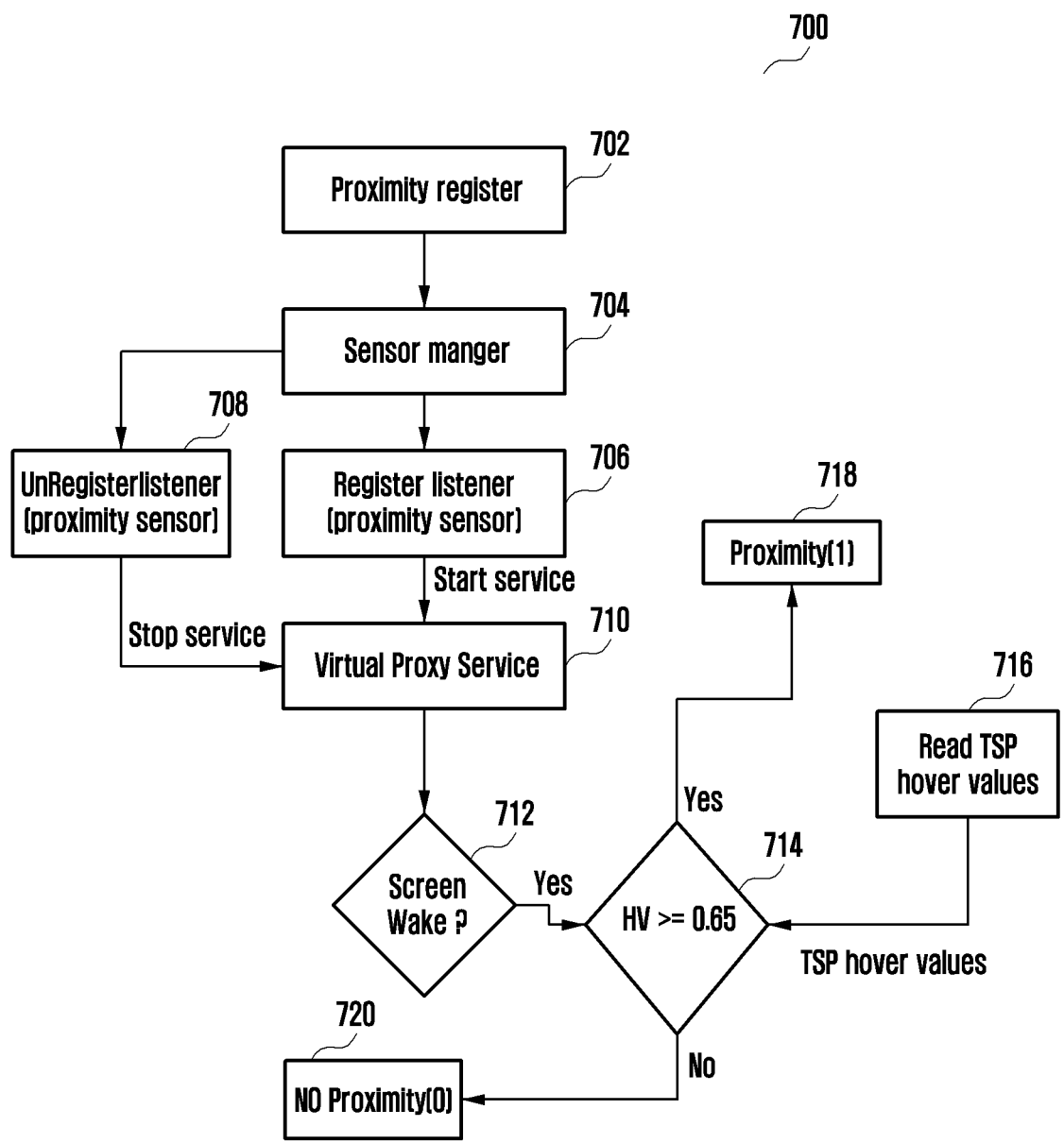
FIG. 7 is a flow diagram illustrating a method for determining a proximity for a pocket mode according to an embodiment of disclosure.

FIG. 7 is a flow diagram 700 illustrating a method for determining a proximity for a pocket mode according to an embodiment of disclosure.

Referring to FIG. 7, the operations (702-720) are performed by the electronic device (100).

At 702-710, the method includes registering proximity sensor value for the proximity sensor when the pocket mode initiated in the electronic device (100) needs the proximity sensor value. Virtual proxy service activates when pocket mode registers the proximity sensor else virtual proxy services deactivates. At 712, the method includes determining status of screen status of the electronic device (100). The proposed method and system calculated the proximity if the screen is active/awake.

At 714-720, the proposed method and system calculates the proximity. The proposed system and method fetching TSP hover data (i.e., the first hover calculation) values on regular intervals of 100 ms is started. TSP hover data consists of 47 values i.e., 32 RX values and 15 TX values. RX and TX Values are extracted from TSP hover data. RX values are filtered from range 26 to 30 and TX values are filtered from range 37 to 41. The proposed method and system considers threshold of 50 TSP hover records. Experimenting with different scenarios, the proposed method and system deduced RX_Threshold=50. TX_Threshold=70. For detecting the proximity by the proposed method and system already described in FIG. 3C to FIG. 5.

Figure 8A:
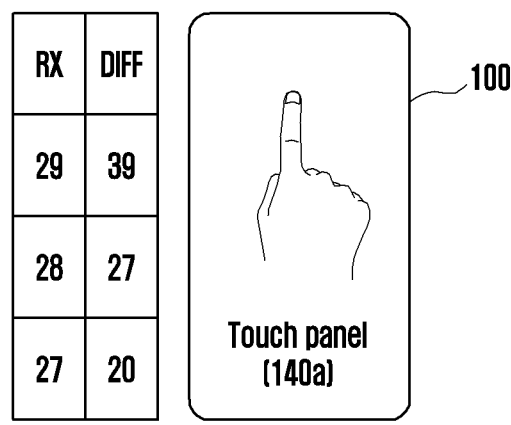
FIGS. 8A and 8B illustrate proximity determination when a call is received and an electronic device is far/near from a user of the electronic device according to various embodiments of disclosure.
Figure 8B:
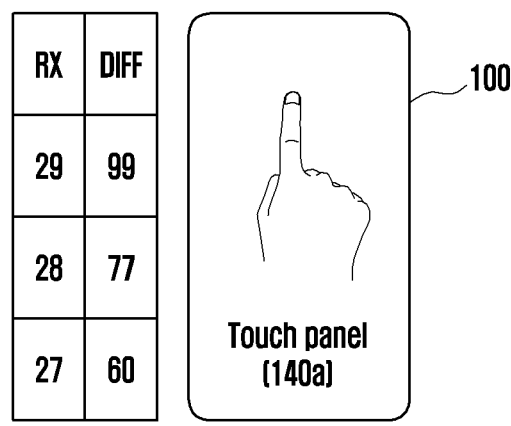

FIGS. 8A and 8B illustrate a proximity determination when a call is received and an electronic device is far/near from a user of an electronic device according to various embodiments of the disclosure.

Referring to FIGS. 8A and 8B, the notation "a" indicates that when the call is received and the electronic device (100) is far from the user of the electronic device (100). Since the electronic device (100) is far, the TSP hover result in the RXDiff<RX_Threshold and TXDiff<TX_Threshold as shown in the heat map the greater difference turned to greater dark map. The value of the HV1 is set to be 0. In addition, when calculating the hover value from trained ML Model, the value of the HV2 is set to be 0. Thus the HV (final hover value) is 0, means no proximity and screen will turn on.

The notation "b" indicates that when the call is received and the electronic device (100) is near to the user of the electronic device (100). Since the electronic device (100) is near, the TSP hover result in the RXDiff>RX_Threshold and TXDiff>TX_Threshold as shown in the heat map the greater difference turned to greater dark map. The value of the HV1 is set to be 1. In addition, when calculating the hover value from trained ML Model, the value of the HV2 is set to be 1. Thus the HV (final hover value) is greater than 0.65, means proximity and screen will turn off.

Figure 9A:
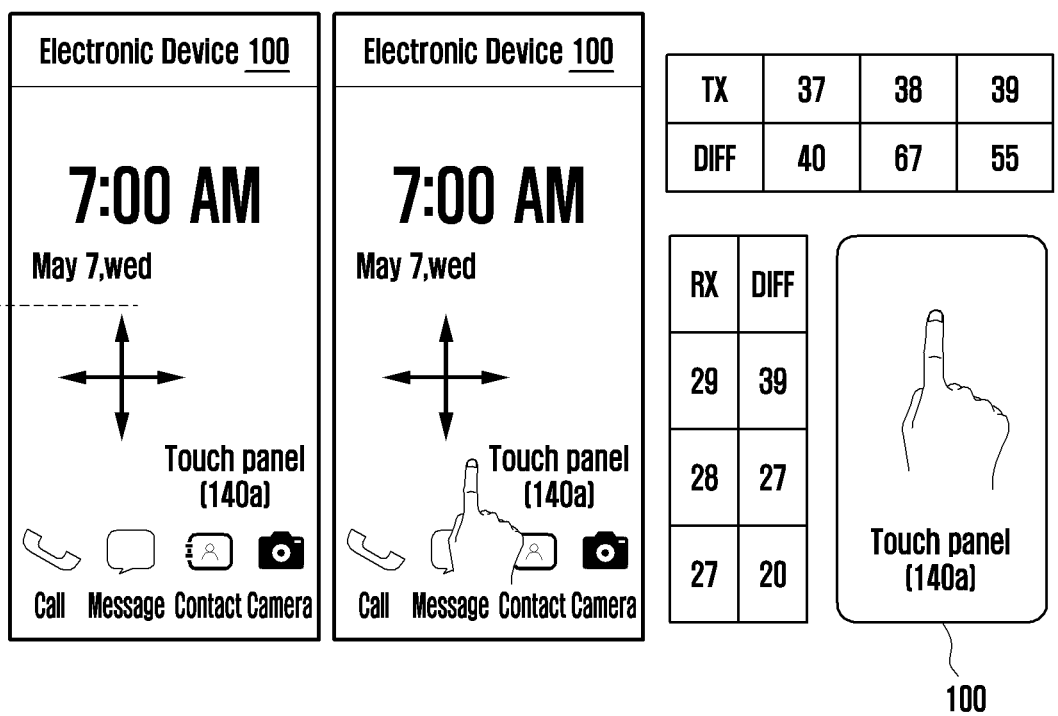
FIGS. 9A and 9B illustrate proximity determination when a hover is performed on second/first half of an electronic device according to various embodiments of the disclosure.
Figure 9B:
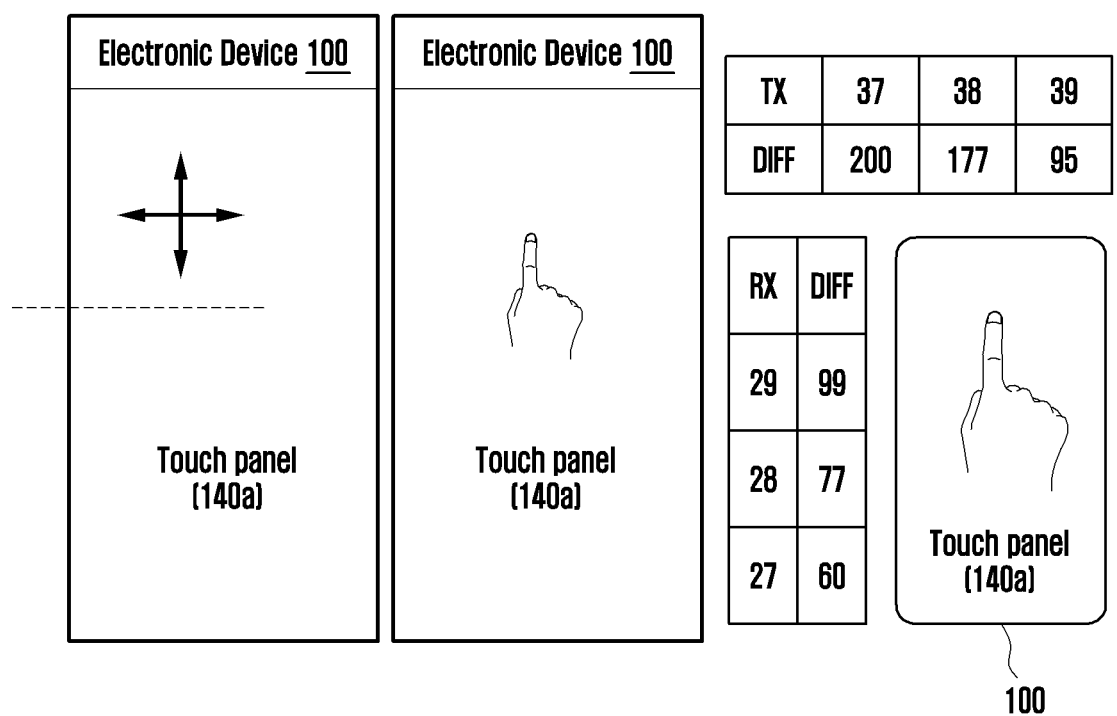

FIGS. 9A and 9B illustrate proximity determination when a hover is performed on second/first half of an electronic device according to various embodiments of the disclosure.

Referring to FIGS. 9A and 9B, the notation "a" indicates that when hover is done on second half or motion is shown in arrow below dotted line. Since the hover is far, the TSP hover result in the RXDiff<RX_Threshold and TXDiff<TX_Threshold as shown in the heat map the greater difference turned to greater dark map. The HV1value is set to 0. In addition, when calculating the hover value from trained ML Model, the value of the HV2 is set to be 0. Thus the HV (final hover value) is 0, means no proximity and screen will turn on.

The notation "b" indicates that when hover is done on first half or motion is shown in arrow below dotted line. Since the hover is far, the TSP hover result in the RXDiff>RX_Threshold and TXDiff>TX_Threshold as shown in the heat map the greater difference turned to greater dark map. The HV1value is set to 1. In addition, when calculating the hover value from trained ML Model, the value of the HV2 is set to be 1. Thus the HV (final hover value) is greater than 0.65, means proximity and screen will turn off.

The embodiments disclosed herein can be implemented using at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method for determining a proximity of at least one object using an electronic device, the method comprising:
    obtaining, by the electronic device, hover data from a touch panel of the electronic device;
    determining, by the electronic device, a first hover and a second hover based on the hover data of the at least one object obtained from the touch panel;
    assigning, by the electronic device, a first dynamic weight to the first hover;
    assigning, by the electronic device, a second dynamic weight to the second hover;
    determining, by the electronic device, a candidate hover based on the first hover, the first dynamic weight assigned to the first hover, the second hover, and the second dynamic weight assigned to the second hover;
    determining, by the electronic device, whether the candidate hover meets a hover threshold; and
    detecting, by the electronic device, that one of the at least one object is in a proximity to the touch panel of the electronic device when the candidate hover meets the hover threshold.

2. The method of claim 1, wherein the first hover is a touch panel calculation-based hover and the second hover is a machine learning (ML)-based hover.

3. The method of claim 1,
    wherein the hover data is obtained based on at least one sensor, and
    wherein the at least one sensor includes one of a capacitive sensor, a resistive sensor, an inductive sensor, an ultrasonic sensor, or a luminance sensor.

4. The method of claim 3, wherein the hover data is obtained based on a change in capacitance of column and row electrodes of the touch panel while a hover of the at least one object is detected over the touch panel of the electronic device.

5. The method of claim 4, wherein the column and row electrodes of the touch panel are automatically configured by:
    detecting, by the electronic device, at least one application running in the electronic device;
    determining, by the electronic device, the column and row electrodes of a row-and-column electrode matrix of the touch screen based on the at least one application running in the electronic device; and
    automatically, by the electronic device, configuring the column and row electrodes to obtain the hover data of the at least one object.

6. The method of claim 4, further comprising:
    setting a range and threshold difference value of the column and row electrodes of the touch panel based on proximity sensor data.

7. The method of claim 1, wherein the determining of the first hover based on the hover data of the at least one object obtained from the touch panel comprises:
    obtaining, by the electronic device, the hover data at a first time;
    obtaining, by the electronic device, the hover data at a second time;
    determining, by the electronic device, a hover data difference between the hover data obtained at the first time and the hover data obtained at the second time;

determining, by the electronic device, whether the hover data difference meets a capacitance threshold; and determining, by the electronic device, the first hover when the hover data difference meets the capacitance threshold.

8. The method of claim 1, wherein the second hover is determined by using a trained probabilistic touch screen panel (TSP) Hover ML model of the touch panel based on the obtained hover data over a plurality of time intervals.

9. The method of claim 8, further comprising:
calculating the probability of the second hover value based on real-time data.

10. The method of claim 1, further comprising:
detecting, by the electronic device, that the at least one object is not in the proximity to the touch panel of the electronic device when the candidate hover does not meets the hover threshold.

11. An electronic device for determining a proximity of at least one object using an electronic device, the electronic device comprising:
a memory; and
at least one processor, operationally coupled to the memory, the at least one processor configured to:
obtain hover data from a touch panel of the electronic device,
determine a first hover and a second hover based on the hover data of the at least one object obtained for from the touch panel,
assign a first dynamic weight to the first hover,
assign a second dynamic weight to the second hover,
determine a candidate hover based on the first hover, the first dynamic weight assigned to the first hover, the second hover, and the second dynamic weight assigned to the second hover,
determine whether the candidate hover meets a hover threshold, and
detect that one of the at least one object is in a proximity to the touch panel of the electronic device when the candidate hover meets the hover threshold.

12. The electronic device of claim 11, wherein the first hover includes a touch panel calculation-based hover and the second hover is a machine learning (ML)-based hover.

13. The electronic device of claim 11,
wherein the hover data is obtained based on at least one sensor, and
wherein the at least one sensor includes one of a capacitive sensor, a resistive sensor, an inductive sensor, an ultrasonic sensor, or a luminance sensor.

14. The electronic device of claim 13, wherein the hover data is obtained based on a change in capacitance of column and row electrodes of the touch panel while a hover of the at least one object is detected over the touch panel of the electronic device.

15. The electronic device of claim 14,
wherein the at least one processor is further configured to automatically configure the column and row electrodes of the touch panel, and
wherein the at least one processor is further configured to:
detect at least one application running in the electronic device;
determine, the column and row electrodes of a row-and-column electrode matrix of the touch screen based on the at least one application running in the electronic device; and
automatically, configure the column and row electrodes to obtain the hover data of the at least one object.

16. The electronic device of claim 11, wherein the at least one processor is further configured to:
obtain the hover data at a first time;
obtain the hover data at a second time;
determine a hover data difference between the hover data obtained at the first time and the hover data obtained at the second time;
determine whether the hover data difference meets a capacitance threshold; and
determine the first hover when the hover data difference meets the capacitance threshold.

17. The electronic device of claim 11, wherein the at least one processor is further configured to determine the second hover by using a trained probabilistic touch screen panel (TSP) Hover ML model of the touch panel based on the obtained hover data over a plurality of time intervals.

18. The electronic device of claim 11, wherein the at least one processor is further configured to:
detect that the at least one object is not in the proximity to the touch panel of the electronic device when the candidate hover does not meet the hover threshold.

* * * * *